United States Patent
Xiang et al.

(10) Patent No.: US 6,812,106 B1
(45) Date of Patent: Nov. 2, 2004

(54) REDUCED DOPANT DEACTIVATION OF SOURCE/DRAIN EXTENSIONS USING LASER THERMAL ANNEALING

(75) Inventors: Qi Xiang, San Jose, CA (US); Robert B. Ogle, San Jose, CA (US); Eric N. Paton, Morgan Hill, CA (US); Cyrus E. Tabery, Cupertino, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/341,366

(22) Filed: Jan. 14, 2003

(51) Int. Cl.$^7$ .................... H01L 21/336; H01L 21/8238

(52) U.S. Cl. ........................ 438/301; 438/232; 438/302

(58) Field of Search ................................. 438/585, 587, 438/588, 592, 163, 229–232; 257/382, 383, 384, 344, 408

(56) References Cited

U.S. PATENT DOCUMENTS

| | | | | |
|---|---|---|---|---|
| 6,482,724 B1 | * | 11/2002 | Chatterjee | 438/525 |
| 6,600,195 B1 | * | 7/2003 | Nishida et al. | 257/335 |
| 6,645,818 B1 | * | 11/2003 | Sing et al. | 438/275 |

\* cited by examiner

*Primary Examiner*—Hung Vu

(57) ABSTRACT

Dopant deactivation of source/drain extensions during silicidation is reduced by forming deep source/drain regions using a disposable dummy gate as a mask, forming metal silicide layers on the deep source/drain regions, removing the dummy gate and then forming the source/drain extensions using laser thermal annealing. Embodiments include angular ion implantation, after removing the dummy gate, to form spaced apart pre-amorphized regions, ion implanting to form source/drain extension implants extending deeper into the substrate than the pre-amorphized regions, and then laser thermal annealing to activate the source/drain extensions having a higher impurity concentration at the main surface of the substrate than deeper into the substrate. Subsequent processing includes forming sidewall spacers, a gate dielectric layer and then the gate electrode.

15 Claims, 4 Drawing Sheets

REDUCED DOPANT DEACTIVATION OF SOURCE/DRAIN EXTENSIONS USING LASER THERMAL ANNEALING

FIELD OF THE INVENTION

The present invention relates to semiconductor devices with accurately formed submicron features. The present invention has particular applicability in manufacturing high density semiconductor devices with transistors exhibiting reduced dopant deactivation of source/drain extensions.

BACKGROUND ART

The increasing demand for micro-miniaturization requires scaling down various horizontal and vertical dimensions in various device structures. As the transistor source/drain junction depth is scaled down, there is a corresponding scaled increase in the substrate channel doping to maintain a constant electric field in the transistor channel for high speed performance. These objectives are achieved, in part, by not only forming shallow junctions but also forming source/drain extensions with an abrupt junction/dopant profile slope in proximity to the transistor channel in order to reduce penetration of the source/drain dopant into the transistor channel which occurs as the junction/profile slope becomes less abrupt. Such short channel effects result in poor threshold voltage roll-off characteristics for sub-micron devices.

High performance microprocessor applications require rapid speed of semiconductor circuitry. Miniaturization requires long interconnects having small contacts and small cross-sections. Accordingly, as design rules continue to plunge into the deep sub-micron regime, low resistivity interconnect paths become more critical. A common approach to reduce resistivity comprises forming metal silicide layers on deep source/drain regions, as by employing conventional salicide technology. Such salicide technology, however, is conducted at elevated temperatures resulting in dopant deactivation, particularly in the gate electrode and in the source/drain extensions, and attendant short channel effects.

Accordingly, there exists a need for methodology enabling the fabrication of semiconductor devices comprising transistors with reduced dopant deactivation of gate electrodes and source/drain extensions. There also exists a need for methodology enabling the fabrication of semiconductor devices comprising transistors having source/drain extensions with abrupt junction profiles and high operating speed, and the resulting semiconductor devices.

DISCLOSURE OF THE INVENTION

An advantage of the present invention is a method of manufacturing a semiconductor device comprising transistors exhibiting reduced dopant deactivation of source/drain extensions, reduced tunneling current, and high operating speed.

Another advantage of the present invention is a semiconductor device comprising transistors with high impurity concentrations source/drain extensions, reduced tunneling current, and high operation speed.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a dummy gate over a main surface of a substrate; forming deep source/drain regions in the substrate; forming metal silicide layers on the deep source/drain regions; forming a gate dielectric layer over the substrate; removing the dummy gate leaving an opening defined by side surfaces of the dielectric layers; ion implanting to form spaced apart source/drain extension implants into substrate; and laser thermal annealing to activate the source/drain extensions.

Another advantage of the present invention is a semiconductor device comprising: a gate electrode over a main surface of a substrate with a gate dielectric layer therebetween; dielectric sidewall spacers on side surfaces of the gate electrode; deep source/drain regions of the substrate; metal silicide layers on the deep source/drain regions; source/drain extensions extending from the main surface under the sidewall spacers into the substrate, the source/drain extensions comprising: an upper portion at the main surface of the substrate having a first impurity concentration; and a lower portion having a second impurity concentration less than the first impurity concentration.

Embodiments of the present invention comprise angular ion implantation to form spaced apart pre-amorphized regions extending into the substrate to a first depth and then ion implanting impurities to form source/drain extension implants overlapping the pre-amorphized regions extending into the substrate to a second depth greater than the first depth. Embodiments of the present invention further include forming the dummy gate over the substrate with an oxide layer thereunder and oxide sidewall spacers thereon, forming the deep source/drain regions and metal silicide layers thereon, depositing the dielectric layer, planarizing, as by chemical mechanical polishing (CMP), removing the dummy gate and underlying oxide layer, forming dielectric sidewall spacers, such as silicon nitride, on the side surfaces of the dielectric layer in the opening, forming a gate dielectric layer on the main surface of the substrate, and then depositing the gate electrode material. Source/drain extensions formed in accordance with the embodiments of the present invention typically comprise an upper portion with an activated impurity concentration of $5 \times 10^{18}$ to $1 \times 10^{20}$ atoms/cm$^3$ and a lower portion having an activated impurity concentration of $5 \times 10^{17}$ to $5 \times 10^{8}$ atoms/cm$^3$.

Additional advantages of the present invention will be readily apparent to those skilled in the art from the following detailed description wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 8, similar features or elements are denoted by similar reference characters.

DESCRIPTION OF THE INVENTION

Figure 1:
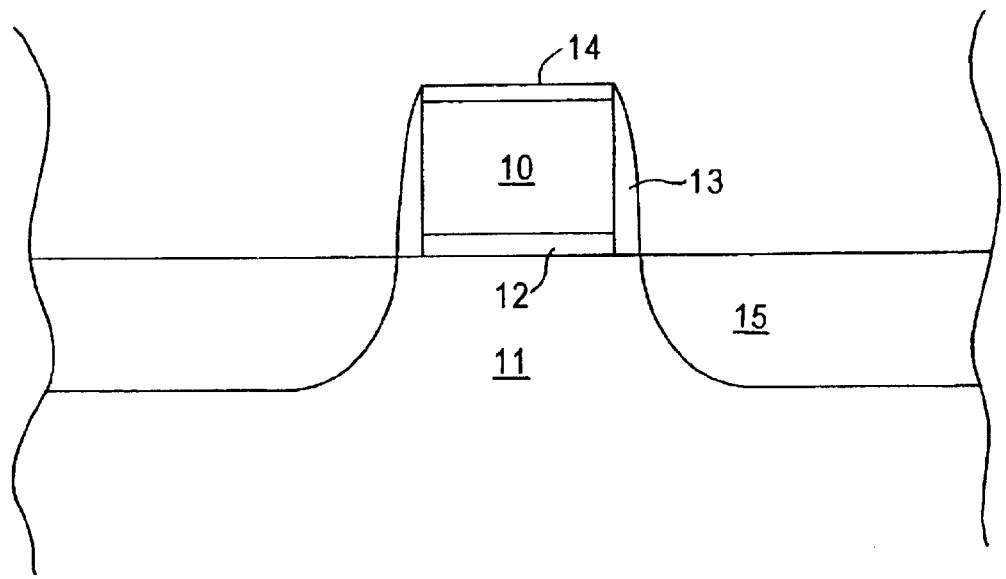
FIGS. 1 through 8 schematically illustrate sequential phases of a method in accordance with an embodiment of the present invention.

The present invention addresses and solves problems attendant upon fabricating semiconductor devices using conventional methodology, such as dopant deactivation of shallow source/drain extensions upon silicidation. The present invention also provides methodology enabling the fabrication of micro-miniaturized semiconductor devices having a gate width independent of conventional photolithographic capabilities and a corresponding reduced gate height, thereby avoiding the formation of gate electrodes with a high aspect ratio without disadvantageously degrading the gate dielectric layer. The present invention also contributes to reduced capacitance by enabling the formation of source/drain extensions having a higher dopant concentration than conventional methodology.

n accordance with embodiments of the present invention, a disposable dummy gate is initially formed over a substrate. Deep source/drain regions are formed and then metal silicide layers are formed thereon. Thus, silicidation of the substrate is conducted prior to forming source/drain extensions. Subsequently, a dielectric layer is deposited and planarized and the dummy gate is removed. At this point spaced apart pre-amorphized regions are formed by angular ion implantation followed angular ion implantation to form source/drain extension implants which extend into the substrate deeper than the pre-amorphized regions. Laser thermal annealing is then conducted which rapidly melts and freezes the source/drain extensions, preserving the supersaturated dopant concentration in the pre-amorphized regions.

Subsequent processing in accordance with embodiments of the present invention comprises forming dielectric sidewall spacers, such as silicon nitride spacers, on the side surfaces of the dielectric layer, and a gate dielectric layer, which can be a deposited high dielectric constant (k) material. A gate electrode is then formed by deposition and planarization to complete the transistor structure.

An embodiment of the present invention is schematically illustrated in FIGS. 1 through 8. Adverting to FIG. 1, a disposable gate 10, such as a polycrystalline silicon is formed over substrate 11, such as doped monochrystalline silicon, with an oxide layer 12 thereunder. Oxide layer 12 may have a thickness of 20 Å to 200 Å. Thin sidewall spacers 13, such as silicon oxide, are formed on the side surfaces of dummy gate 10, as at a thickness of 40 Å to 100 Å. Reference character 14 denotes an antireflective coating, such as silicon oxynitride or silicon nitride.

Figure 2:
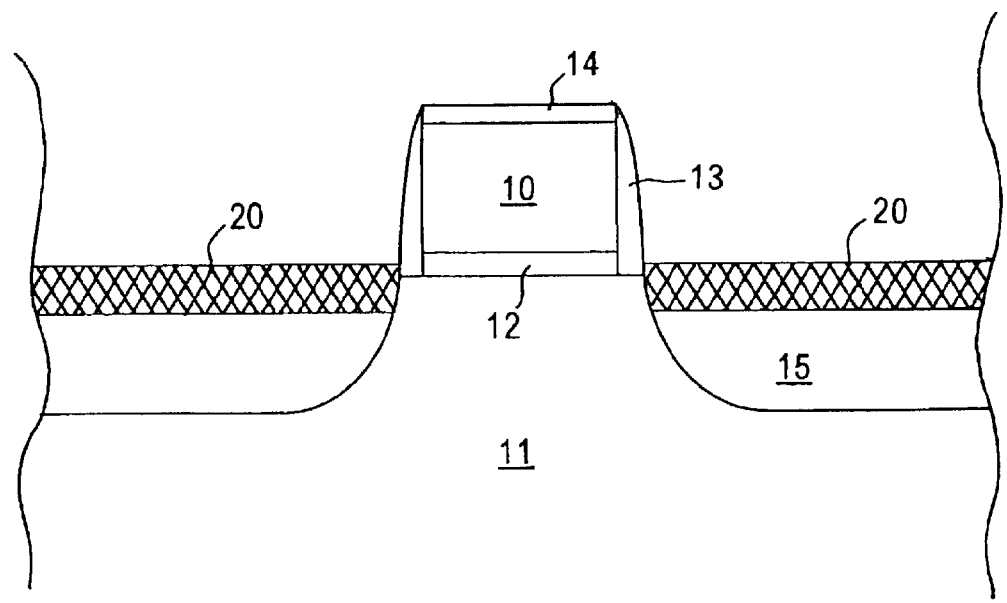

Ion implantation is conducted followed activation, as by rapid thermal annealing at a temperature of 1000° C. to 1100° C. to form deep source/drain regions 15, typically at a depth of 500 Å to 2,000 Å. Subsequently, as illustrated in FIG. 2, metal silicide layers 20 are formed on deep source/drain regions 15. Metal silicide layers can comprise nickel silicide, cobalt silicide or tungsten silicide. Advantageously, by forming metal silicide layers 20 from nickel silicide, a lower thermal budget is required, such as silicidation at a temperature of about 600° C. Metal silicide layers 20 are typically formed at a thickness of 50 Å to 200 Å.

Figure 3:
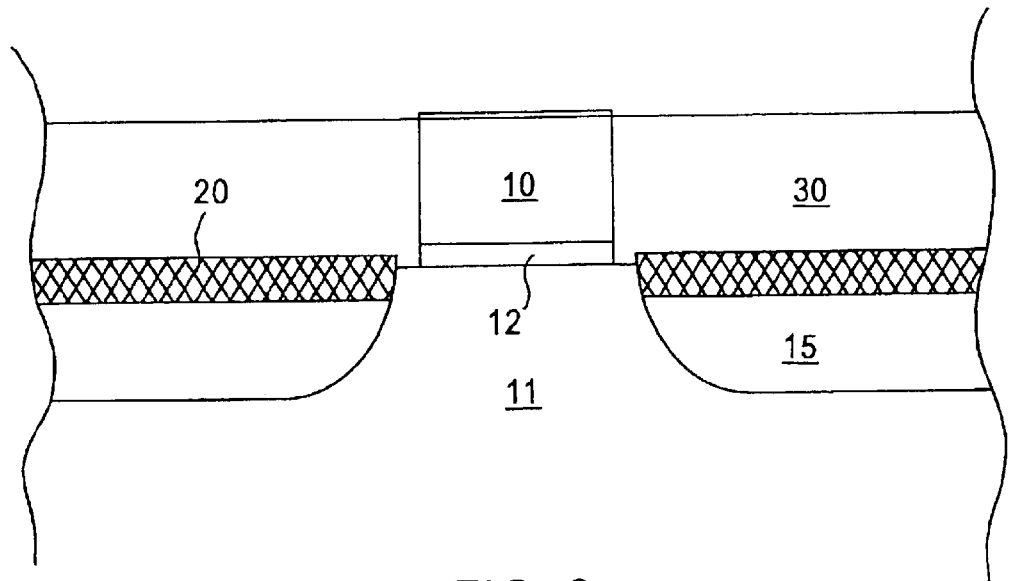

Subsequently, as illustrated in FIG. 3, a dielectric layer 30, such as silicon oxide or silicon nitride, is deposited, followed by CMP such that the upper surface of dielectric layer 30 is substantially coplanar with the upper surface of dummy gate 10. During planarization, antireflective coating 14 may be removed. The thin oxide spacers 13 may be removed: prior to depositing the dielectric layer 30.

Figure 4:
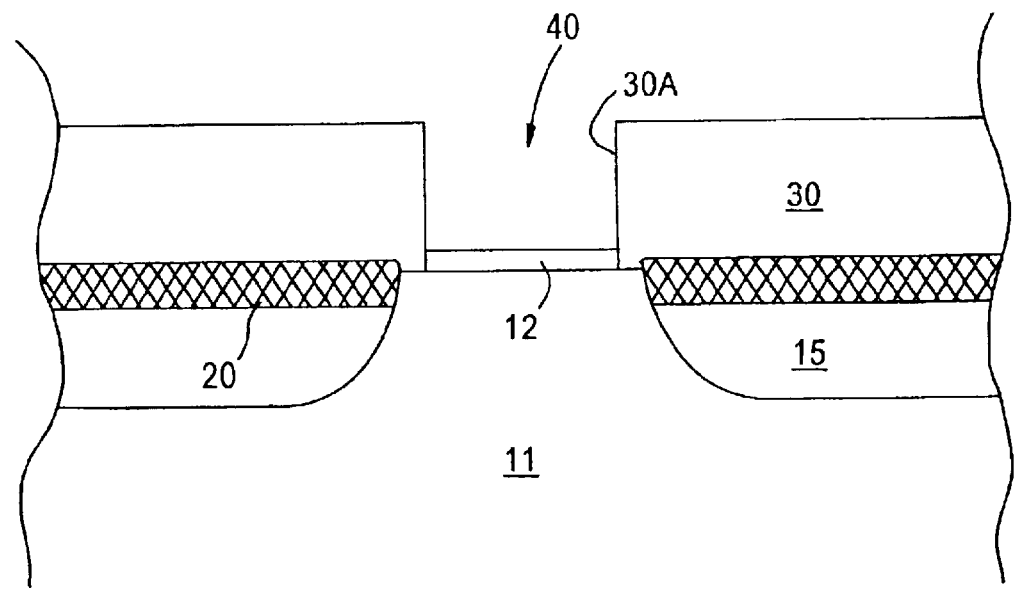

Adverting to FIG. 4, dummy gate 10 is then removed, as by employing a conventional wet or dry etching recipe. For example, polysilicon dummy gate 10 may be removed using an isotropic wet etchant comprising a solution of hydrofluoric acid and nitric acid in acetic acid, leaving an opening 40 defined, in part, by side surfaces 30A of dielectric layer 30.

Figure 5:
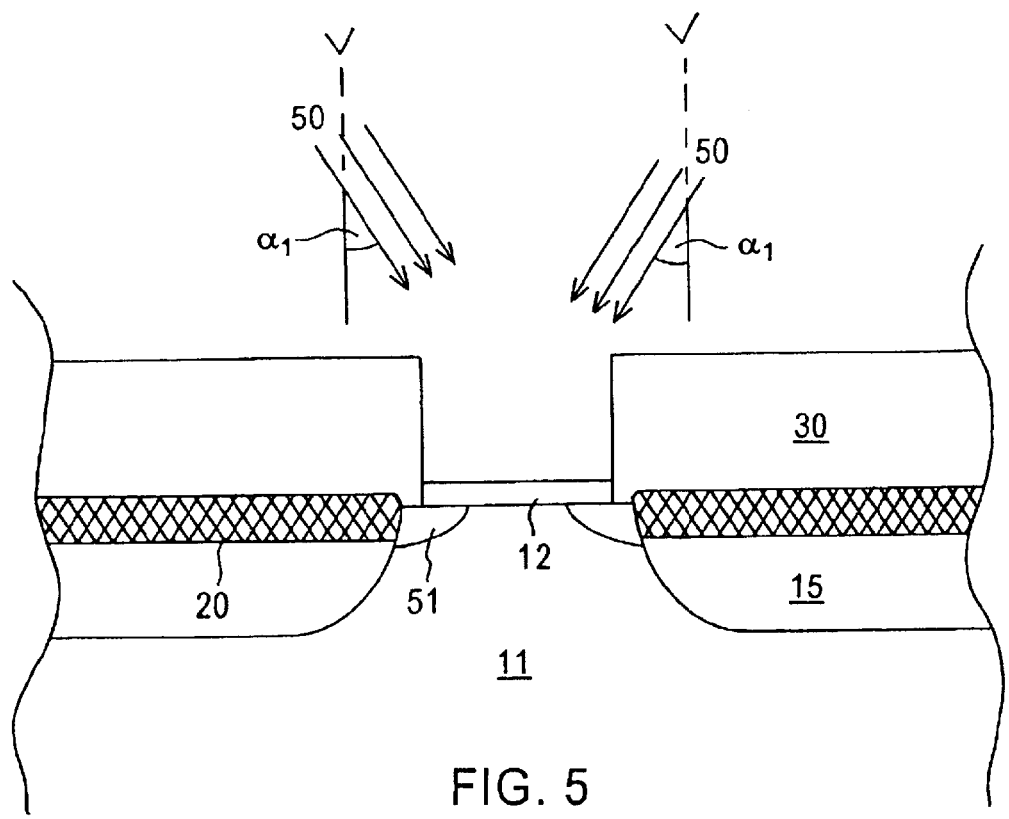

Adverting to FIG. 5, ion implantation is then conducted, as illustrated by arrows 50, to form spaced apart pre-amorphized regions 51 in substrate 11. Ion implantation 50 may be conducted at an angle $\alpha$ with respect to a line V perpendicular to an upper surface of the substrate, such as an angle $\alpha_1$ of 15° to 45°, advantageously utilizing the shadowing effect of layer 30 thereby avoiding implantation into the channel region. Ion implantation 50 may be conducted by implanting silicon (Si), germanium (Ge), or xenon (Xe), to form pre-amorphized regions 51 extending into the substrate to a depth of 50 Å to 200 Å. For example, Xe may be implanted at an implantation dosage of $1 \times 10^{14}$ to $5 \times 10^{14}$ ions/cm$^2$ at an implantation energy of 10 to 40 KeV. Ion implantation 50 may be conducted at an angle a, of 15° to 45°.

Figure 6:
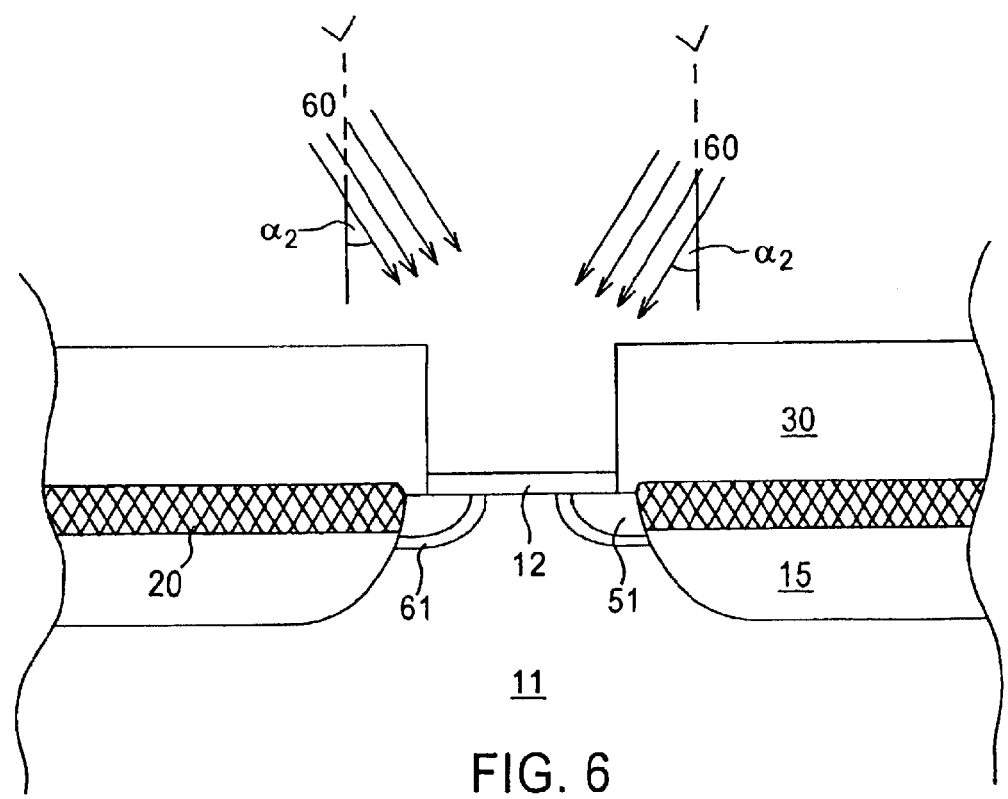

As illustrated in FIG. 6, a dopant impurity is then ion implanted to form shallow source/drain extension implants 61 which overlap pre-amorphized regions 51 and extend into the substrate to a depth greater than the depth of pre-amorphized regions 51. Source/drain extension implants 61 typically extend into the substrate to a depth of 100 Å to 200 Å. Ion implantation 60 to form source/drain implant 61 to be conducted at an angle $\alpha_2$ of 15° C. to 45° C., as by implanting As$^+$ at an implantation dosage of $1 \times 10^{14}$ to $5 \times 10^{14}$ ions/cm$^2$ at an implantation energy of to 1 to 5 KeV.

Figure 7:
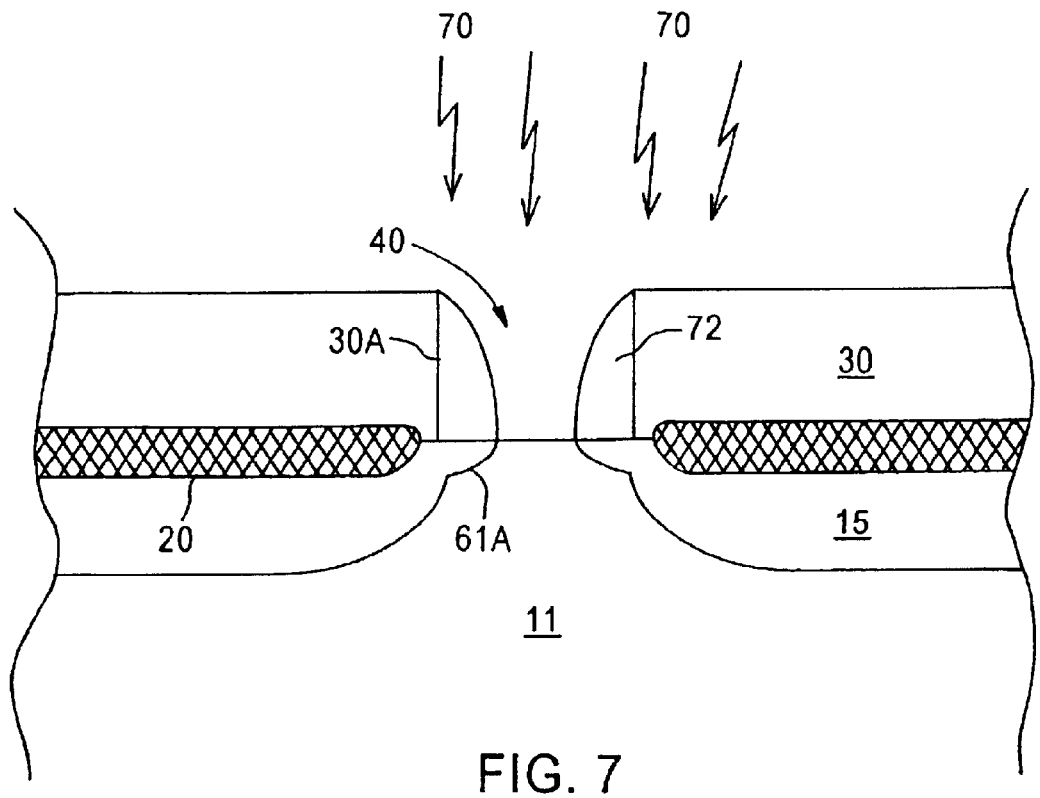
Figure 8:
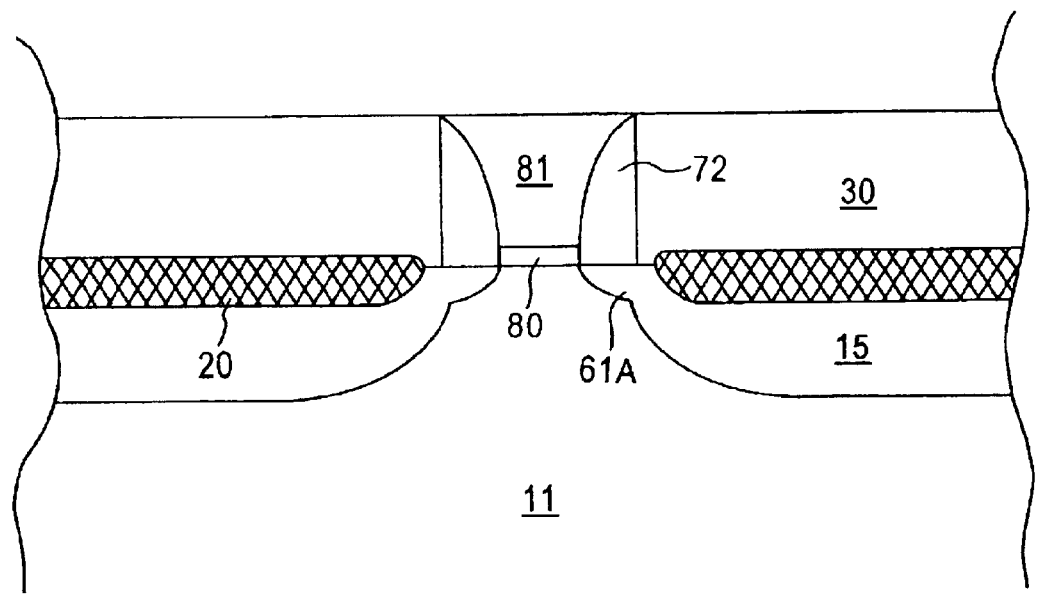

Subsequently, laser thermal annealing is conducted, as schematically illustrated by arrows 70 in FIG. 7, to recrystallize pre-amorphized regions 51 and activate the source/drain extension implants forming source/drain extensions 61A. Oxide layer 12 is then removed and sidewall spacers 72, such as silicon nitride, are formed on side surfaces 30A of dielectric layer 30 within opening 40. Such laser thermal annealing may be conducted by impinging a pulsed laser light beam at a radiant fluence of 0.2 to 0.8 joules/cm$^2$ for 1 to 10 nanoseconds, thereby rapidly elevating the substrate temperature to 1,200° C. to 1,300° C. During laser thermal annealing, the substrate is rapidly melted and quenched, thereby preserving the supersaturated dopant concentration of the source/drain extensions in the pre-amorphized region resulting in a desirably high dopant concentration at the substrate surface. In addition, the combined use of pre-amorphizing and laser thermal annealing enables the accurate formation of shallow source/drain extensions with abrupt junction profiles A gate dielectric layer 80 is formed, as shown in FIG. 8. A gate electrode material is then deposited and planarized, as by CMP, thereby forming gate electrode 81. Gate dielectric layer 80 may comprise a thermal silicon oxide layer, as at a thickness of 5 Å to 20 Å, e.g., 15 Å. Alternatively, gate dielectric layer 80 may be advantageously deposited, as by depositing a material having a high dielectric constant (k), such as a dielectric constant (k) of 10 or higher, with a value of 1 being the dielectric constant of a vacuum. Suitable high dielectric constant (k) materials may be selected from the group consisting of metal oxides, metal silicates metal aluminates, metal titanates, metal zirconates, ferroelectric materials, binary metal oxides, and ternary metal oxides. Suitable metal oxides includes aluminum oxide, hafnium oxide, zirconium oxide, lanthanum oxide, titanium oxide, tantalum oxide, tungsten oxide, cerium oxide, and yttrium oxide; suitable metal silicates include zirconium silicate, and hafnium silicate; suitable metal aluminates include hafnium aluminate and lanthanum aluminate; suitable metal titanates include lead titanate, barium titanate, strontium titanate, and barium strontium titanate; suitable metal zirconates include lead zirconate; and suitable ferroelectric and/or ternary metal oxides include PST ($PbSc_xTa_{1-x}O_3$), PZN ($PbZn_xNb_{1-x}O_3$), PZT ($PbZr_xTi_{1-x}O_3$), and PMN ($PbMg_xNb_{1-x}O_3$).

Advantageously, deposited high dielectric constant gate dielectric layer 80 may be formed at a thickness of 30 Å to 100 Å and achieve a performance similar to that of a thin thermally formed silicon oxide layer but with a reduced tunneling current. The present invention addresses and solves problems attendant upon conventional methodology, particularly deactivation of dopants in the gate electrode and in the source/drain extensions during silicidation, which dopant deactivation is manifested by an increase in resistivity. The present invention addresses and solves that problem by strategically forming deep source/drain regions and silicide layers prior to forming shallow source/drain extensions. By combining pre-amorphization and laser thermal annealing source/drain extensions are formed with abrupt function profiles and having a high dopant concentration, particularly at the surface of the substrate, thereby reducing resistance. In addition, embodiments of the present invention enable decoupling the gate width from photolithographic limitations, so that the width of the gate electrode is not limited by the resolution capabilities of conventional photolithographic techniques. Further, the height of the gate electrode is not limited by the necessity of preventing dopants from penetrating therethrough into the underlying gate dielectric layer causing degradation thereof. Accordingly, the present methodology enables the fabrication of semiconductor devices comprising transistors having a gate electrode with a width of 100 Å to 10,000 Å and a height of 100 Å to 1,000 Å.

The strategic use of laser thermal annealing to activate the source/drain extensions enables pinpoint accuracy in targeting specific areas of the surface of the substrate, thereby avoiding unnecessarily elevating temperature of other portions of the substrate causing various problems, such as defects and diffusion issues.

In implementing embodiments of the present invention, any of various commercially available laser tools may be employed, such as those utilizing a laser source capable of operating at energies of about 10 to about 2,000 mJ/cm²/pulse, e.g., about 100 to 400 mJ/cm²/pulse. Commercially available tools exist which can perform such laser annealing, either with or without a mask. The Verdant Technologies laser anneal tool is but an example and operates at an exposure wavelength of 308 mn.

The present invention enjoys industrial applicability in fabricating various types of highly miniaturized semiconductor devices with improved reliability and reproducibility. The present invention has particular applicability in fabricating semiconductor devices with design features in the deep submicron regime, as with a design rule of about 0.12 micron and under, with significant improved reliability and proved manufacturing throughput.

In the preceding detailed description, the present invention is described with reference to specific exemplary embodiments thereof. It will, however, be evident that various modifications and changes may be made thereto, without departing from the broader scope of the present invention, as set forth in the claims. The specification and drawings are, accordingly, to be regarded as illustrative and not as restrictive. It is understood that the present invention is capable of using various other combinations and environments and is capable of changes or modifications within the scope of the inventive concept as expressed herein.

What is claimed is:

1. A method of manufacturing a semiconductor device, the method comprising sequentially:
    forming a dummy gate over a main surface of a substrate;
    forming deep source/drain regions in the substrate;
    forming metal silicide layers on the deep source/drain regions;
    forming a dielectric layer over the substrate;
    removing the dummy gate leaving an opening defined by side surfaces in the dielectric layer;
    ion implanting to form spaced apart source/drain extension implants in the substrate; and
    laser thermal annealing to activate source/drain extensions.

2. A method of manufacturing a semiconductor device, the method comprising:
    forming a dummy gate over a main surface of a substrate;
    forming deep source/drain regions in the substrate;
    forming metal silicide layers on the deep source/drain regions;
    forming a dielectric layers over the substrate;
    removing the dummy gate leaving an opening defined by side surfaces in the dielectric layer;
    forming spaced apart pre-amorphized regions extending into the substrate to a first depth; and
    ion implanting to form spaced apart source/drain extension implants overlapping the pre-amorphized regions and extending into the substrate to a second depth greater than the first depth; and
    laser thermal annealing to activate source/drain extensions.

3. The method according to claim 2, comprising:
    forming the dummy gate over the substrate with an oxide layer therebetween;
    forming oxide sidewall spacers on the dummy gate;
    forming the deep source/drain regions and metal silicide layers thereon;
    depositing the dielectric layer;
    planarizing such that an upper surface of the dielectric layer is substantially coplanar with an upper surface of the dummy gate; and
    forming the dummy gate and underlying oxide layer.

4. The method according to claim 3, comprising:
    forming the dummy gate from polycrystalline silicon; and
    forming the dielectric layer from silicon oxide or silicon nitride.

5. The method according to claim 2, comprising:
    ion implanting at an angle of 15° to 45° to a line perpendicular to the main surface of the substrate to form the pre-amorphized regions; and
    ion implanting at an angle of 15° to 45° to a line perpendicular to the main surface of the substrate to form the source/drain extension implants.

6. The method according to claim 2, comprising:
    forming the pre-amorphized regions at the first depth of 50 Å to 200 Å; and
    forming the source/drain extension implants at the second depth of 100 Å to 200 Å.

7. The method according to claim 2, comprising laser thermal annealing by impinging a laser light beam at a radiant fluence of 0.2 to 0.8 joules/cm2 for 1 to 10 nanoseconds.

8. The method according to claim 2, further comprising:

forming dielectric sidewall spacers on the side surfaces of the dielectric layer in the opening;

forming a gate dielectric layer on the main surface of the semiconductor substrate between the dielectric sidewall spacers; and forming a gate electrode over the gate dielectric layer adjacent the dielectric sidewall spacers.

9. The method according to claim 8, comprising forming the dielectric sidewall spacers from silicon nitride.

10. The method according to claim 8, comprising forming the gate electrode by depositing polycrystalline silicon or a metal.

11. The method according to claim 8, comprising forming the gate dielectric layer from silicon oxide.

12. The method according to claim 11, comprising forming the silicon oxide gate dielectric layer at a thickness of 5 Å to 20 Å.

13. The method according to claim 8, comprising forming the gate dielectric layer by depositing material having a dielectric constant (k) of 10 or higher.

14. The method according to claim 13, comprising forming the gate dielectric layer at a thickness of 30 Å to 100 Å.

15. The method according to claim 13, comprising forming the gate dielectric layer from a material selected from the group consisting of metal oxides, metal silicates, metal aluminates, metal titanates, metal zirconates, ferroelectric materials, binary metal oxides, and lernary metal oxides.

* * * * *